US012588276B2

(12) United States Patent　　(10) Patent No.: US 12,588,276 B2

C et al.　　(45) Date of Patent: Mar. 24, 2026

(54) LOGIC CELL STRUCTURE WITH DIFFUSION BOX

(71) Applicant: Arm Limited, Cambridge (GB)

(72) Inventors: Rakshith C, Bangalore (IN); Denil Das Kolady, Bangalore (IN); Ashwani Kumar Srivastava, Austin, TX (US)

(73) Assignee: Arm Limited, Cambridge (GB)

( * ) Notice: Subject to any disclaimer, the term of this patent is extended or adjusted under 35 U.S.C. 154(b) by 320 days.

(21) Appl. No.: 17/487,477

(22) Filed: Sep. 28, 2021

(65) Prior Publication Data

US 2023/0095459 A1　　Mar. 30, 2023

(51) Int. Cl.
　　H10D 84/85　　(2025.01)
　　H10D 84/01　　(2025.01)
　　H10D 84/03　　(2025.01)

(52) U.S. Cl.
　　CPC ......... H10D 84/85 (2025.01); H10D 84/0191 (2025.01); H10D 84/038 (2025.01)

(58) Field of Classification Search
　　CPC .............. H01L 27/0207; H01L 27/092; H01L 21/823892; H01L 21/823807; H01L 21/823878; H01L 2027/11831; H10D 84/85; H10D 84/8311; H10D 84/8312; H10D 84/83135; H10D 84/83138; H10D 84/8314; H10D 84/8316; H10D 84/851; H10D 84/852; H10D 84/038; H10D 84/01; H10D 84/931; H10D 84/0167; H10D 84/0188; H10D 89/10
　　See application file for complete search history.

(56) References Cited

U.S. PATENT DOCUMENTS

| | | | |
|---|---|---|---|
| 7,679,106 B2 * | 3/2010 | Hamada | H01L 27/0207 257/210 |
| 8,203,173 B2 * | 6/2012 | Uemura | H01L 27/11803 438/587 |
| 8,294,212 B2 * | 10/2012 | Wang | H10B 10/12 257/390 |
| 9,634,026 B1 * | 4/2017 | Sahu | H03K 19/17736 |
| 2005/0205894 A1 * | 9/2005 | Sumikawa | H01L 27/11807 257/288 |
| 2005/0280031 A1 * | 12/2005 | Yano | H01L 27/11807 257/210 |

(Continued)

OTHER PUBLICATIONS

Cline, et al.; STEEL: A Technique for Stress-Enhanced Standard Cell Library Design; 2008 IEEE/ACM International Conference on Computer-Aided Design; pp. 691-697; Nov. 2008.

*Primary Examiner* — Telly D Green

(74) *Attorney, Agent, or Firm* — Pramudji Law Group PLLC; Ari Pramudji

(57) ABSTRACT

Various implementations described herein refer to a device having a cell structure with multiple transistors including active n-type transistors and active p-type transistors disposed together within a cell boundary. The active n-type transistors may have a first diffusion region formed within the cell boundary at a first end of the cell structure. The active p-type transistors may have a second diffusion region formed within the cell boundary at a second end of the cell structure. The active p-type transistors may have a vacated region cut-out from the second diffusion region, and/or the active n-type transistors may have a vacated region cut-out from the first diffusion region.

13 Claims, 9 Drawing Sheets

(56) References Cited

U.S. PATENT DOCUMENTS

| 2007/0111405 A1* | 5/2007 | Watanabe | H01L 27/11807 |
| | | | 438/142 |
| 2010/0187609 A1* | 7/2010 | Moroz | H10D 89/10 |
| | | | 257/E27.06 |
| 2013/0207198 A1* | 8/2013 | Becker | H10B 10/10 |
| | | | 257/369 |
| 2014/0223395 A1* | 8/2014 | Moroz | H10D 64/257 |
| | | | 716/54 |
| 2021/0249400 A1* | 8/2021 | Yadoguchi | H03K 19/0948 |

* cited by examiner

100C

Hybrid Cell Architecture 104C

High-Drive Cell Architecture 804

800

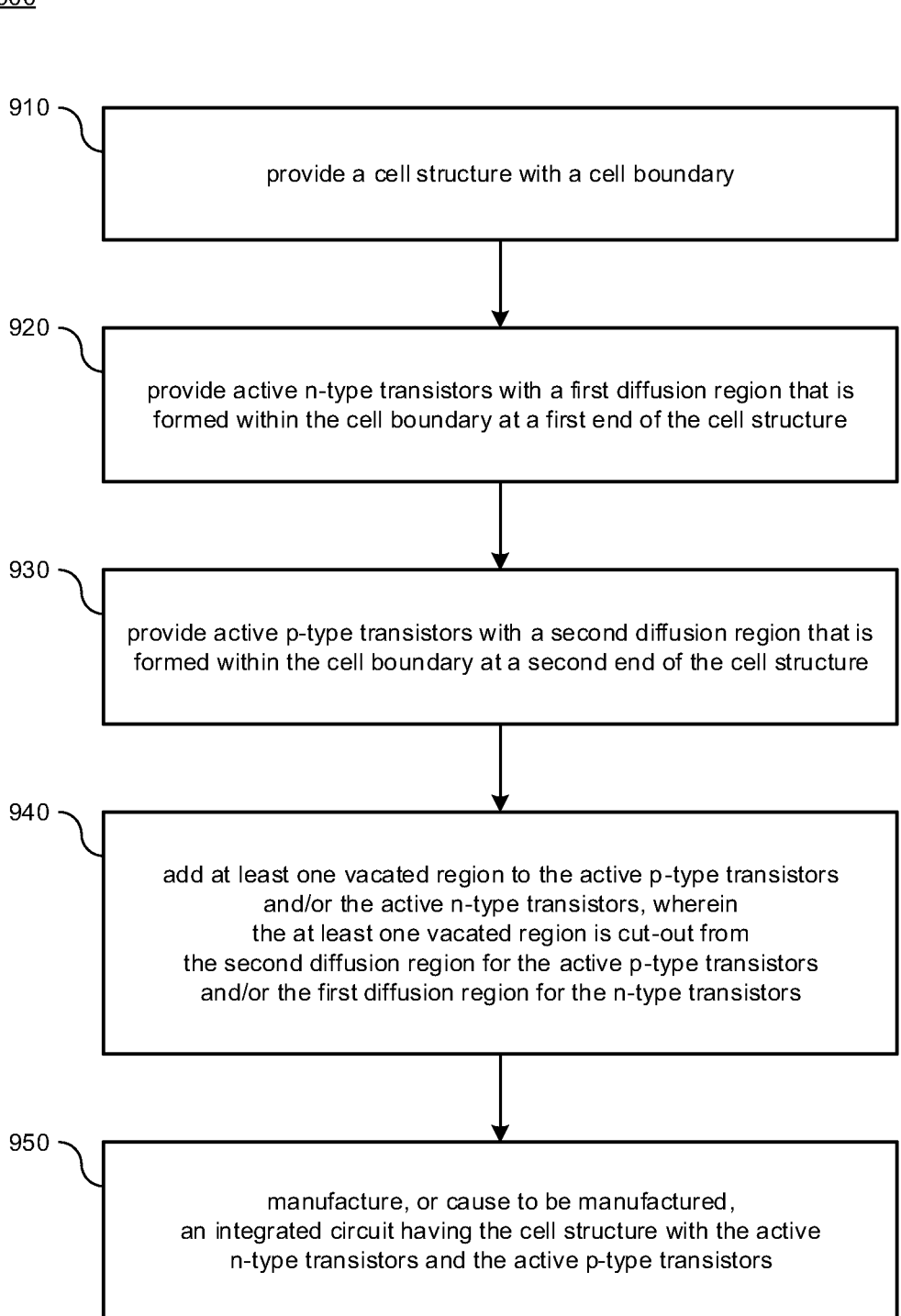

900

910 — provide a cell structure with a cell boundary

920 — provide active n-type transistors with a first diffusion region that is formed within the cell boundary at a first end of the cell structure 930 — provide active p-type transistors with a second diffusion region that is formed within the cell boundary at a second end of the cell structure 940 — add at least one vacated region to the active p-type transistors and/or the active n-type transistors, wherein the at least one vacated region is cut-out from the second diffusion region for the active p-type transistors and/or the first diffusion region for the n-type transistors 950 — manufacture, or cause to be manufactured, an integrated circuit having the cell structure with the active n-type transistors and the active p-type transistors

FIG. 9

LOGIC CELL STRUCTURE WITH DIFFUSION BOX

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional continuous diffusion cell architecture designs, high-drive cells and low-drive cells are inefficient and typically lack performance due to timing variability. For instance, in some scenarios, conventional high-drive cells and low-drive cells have inactive/dummy transistors including at cell boundary that cause adverse timing variation during operation. Thus, there exists a need to improve the efficiency of high-drive cells and low-drive cells so as to enhance performance, e.g., by reducing timing variability in modern cell architecture designs.

BRIEF DESCRIPTION OF THE DRAWINGS

Implementations of various standard cell layout schemes and techniques are described herein with reference to the accompanying drawings. It should be understood, however, that the accompanying drawings illustrate only various implementations described herein and are not meant to limit embodiments of various techniques described herein.

FIG. 9 illustrates a diagram of a method for providing various cell architectures in accordance with various implementations described herein.

DETAILED DESCRIPTION

Various implementations described herein are directed to various cell architectures utilizing high-drive and/or low-drive schemes and techniques for supporting reduced timing variability in reference to physical circuit designs. For instance, the various implementations described herein may provide for uniform diffusion box logic cell architecture to reduce timing variability in various physical design applications. Various implementations described herein may refer to adding a uniform diffusion box having an affixed width and height at east/west side boundaries at the cell architecture level so as to improve timing variability in different cell level contexts at block level, e.g., when a dummy/inactive (tie-gate) transistor at the cell boundary is present in the cell architecture.

For high-drive cells, a diffusion box may be merged without any projection, but for low-drive cells, a clear diffusion box may be used. In some scenarios, the size of the diffusion box at the cell boundary may be kept in such a way so as to make block level cell placement legal, and a diffusion box height may be determined, e.g., by providing a maximum transistor width cell architecture, while a diffusion box width is decided by architecture design rules. In other scenarios, an inactive gate (tie-gate) present at the cell boundary may be used to make cell placement without any restriction. Also, using a uniform diffusion box over east/west cell boundaries for a dummy/inactive transistor may be used to provide reduced timing variation at block level when high-drive cells and low-drive cells are placed together to keep symmetrical contexts at boundary of high and low drive cells. In some scenarios, depending on the cell type, timing variation may be reduced with slight increase in cell delay and leakage but no impact to cell area.

Various implementations of providing various cell architectures with a diffusion box will be described herein with reference to FIGS. 1A-1F and 2-9.

Figures 1A, 1B:
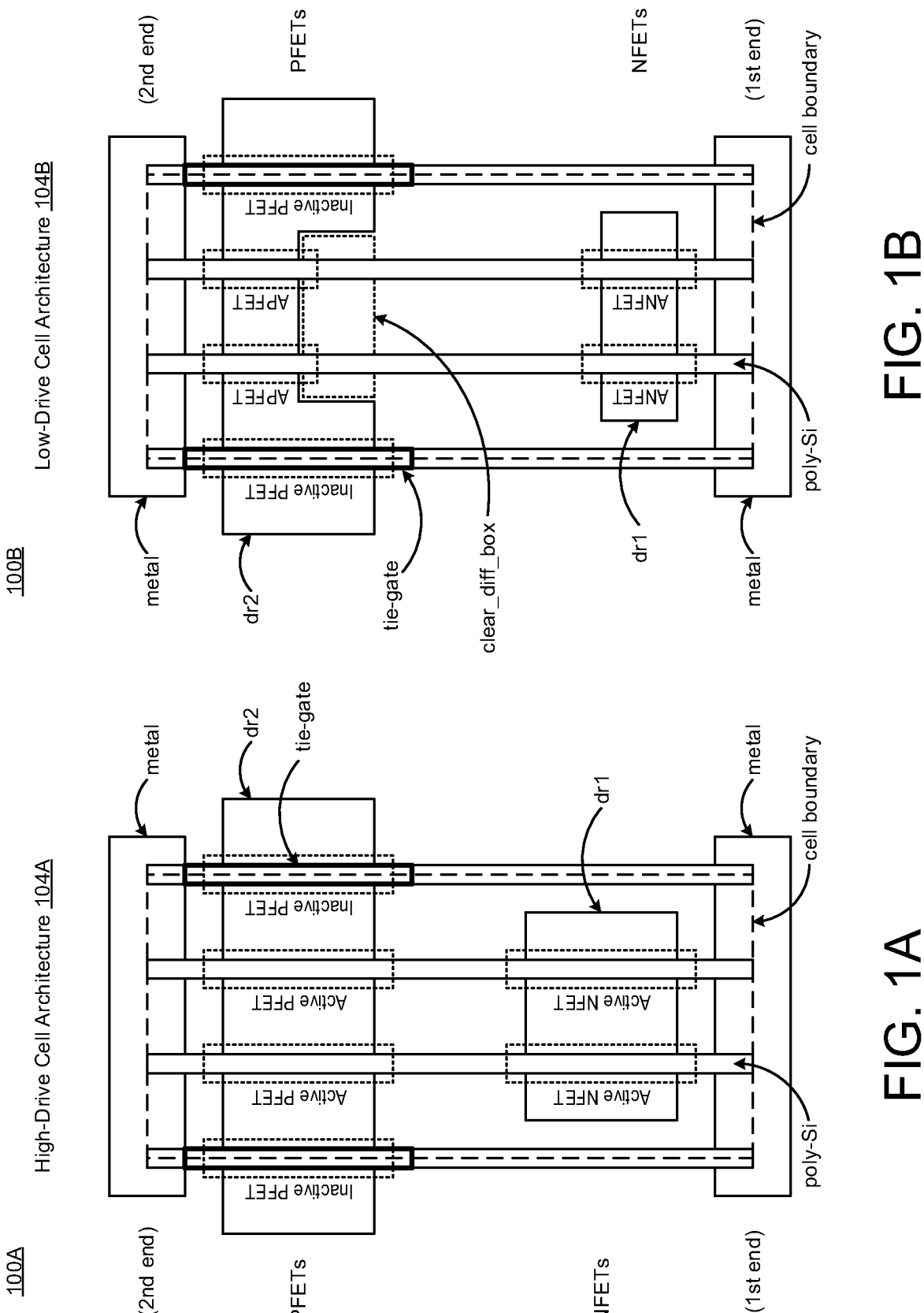
FIGS. 1A-1F illustrate diagrams of various cell architectures in accordance with various implementations described herein.
Figure 1C:
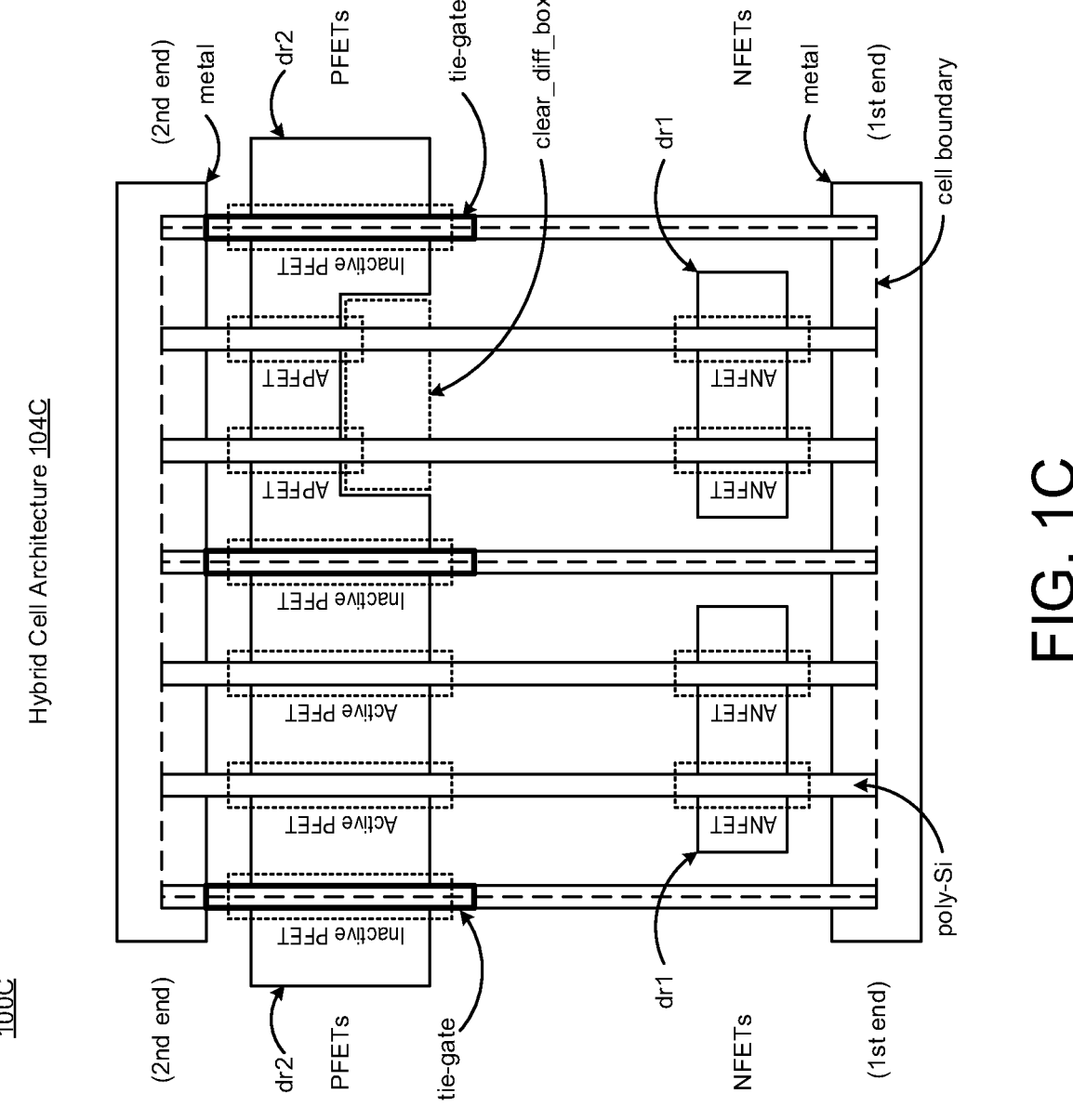
Figure 1D:
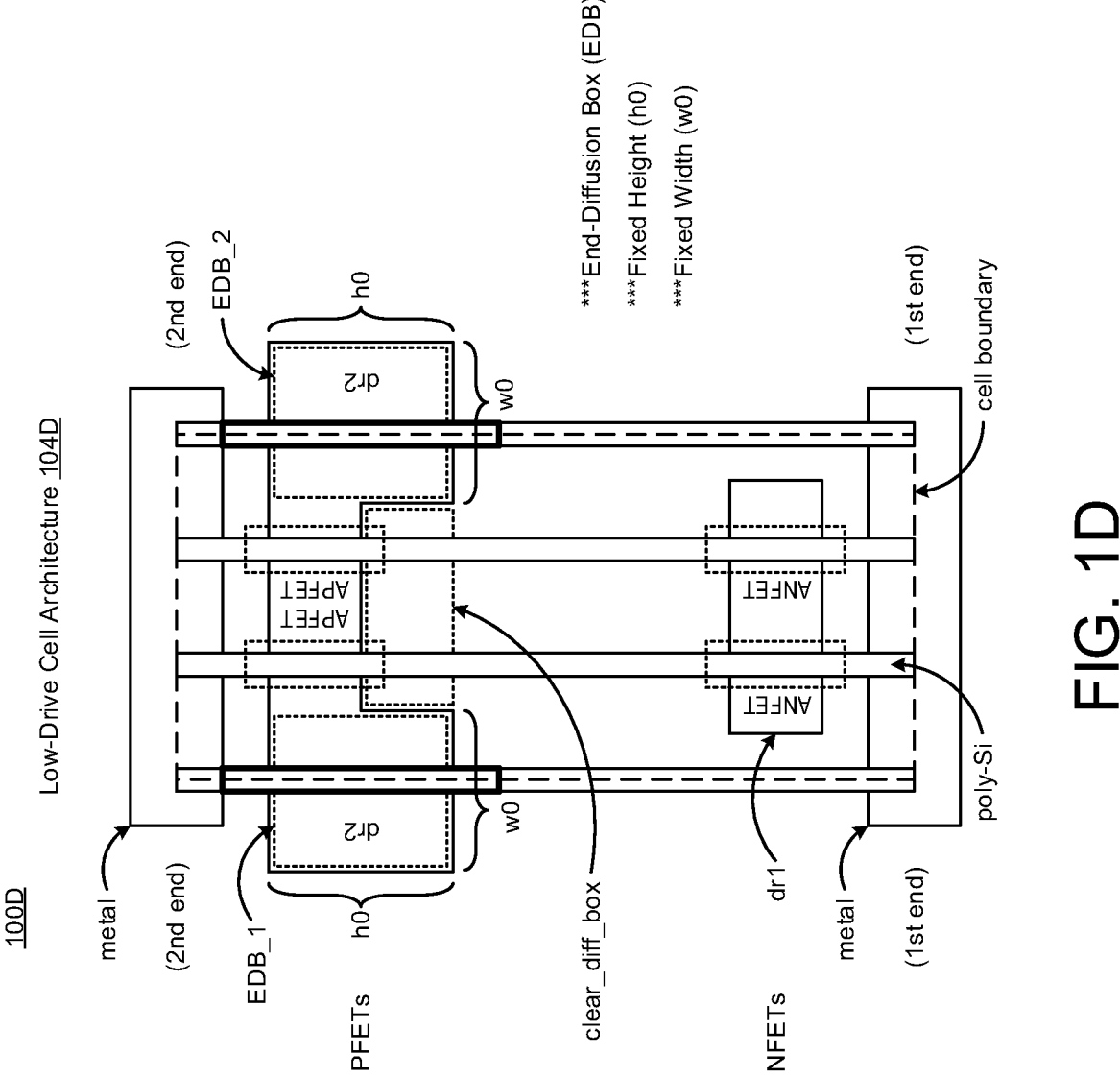
Figures 1E, 1F:
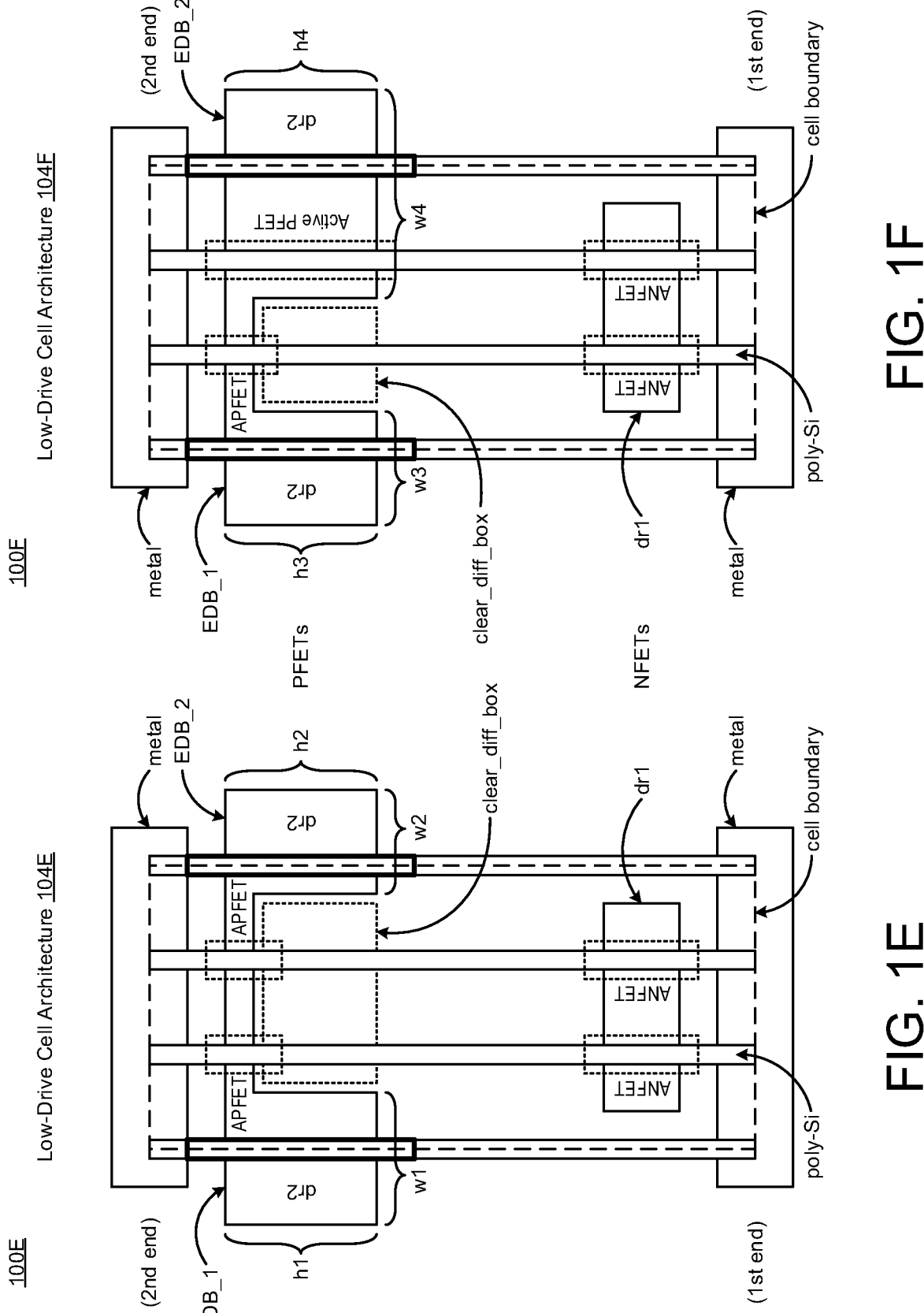

FIGS. 1A-1F illustrate diagrams of various cell architectures in accordance with various implementations described herein. In particular, FIG. 1A shows a diagram 100A of a cell architecture 104A with a high-drive cell structure, FIG. 1B shows a diagram 100B of a cell architecture 104B with a low-drive cell structure, FIG. 1C shows a diagram 100C of a cell architecture 104C with a hybrid cell structure, FIG. 1D shows a diagram 100D of a cell architecture 104D with a low-drive cell structure, FIG. 1E shows a diagram 100E of a cell architecture 104E with a low-drive cell structure, and FIG. 1F shows a diagram 100F of a cell architecture 104F with a low-drive cell structure.

In various implementations, the various cell architectures may be implemented as a system or a device having various integrated circuit (IC) components that are arranged and coupled together as an assemblage or a combination of parts that provide for physical circuit designs and related circuit structures. In some instances, a method of designing, providing, fabricating and manufacturing various cell architectures as an integrated system or device may involve use of various IC circuits and components described herein so as to implement various related fabrication schemes and techniques associated therewith. Also, the various cell architectures may be integrated with various computing circuitry and components on a single chip, and the various cell architectures may be implemented and/or incorporated in various types of embedded systems for automotive, electronic, mobile, server and Internet-of-things (IoT) applications, including remote sensor nodes.

As shown in FIG. 1A, the cell architecture 104A may be implemented with a high-drive logic cell structure and various diffusion box regions. For instance, the cell architecture 104A may refer to the cell structure with multiple transistors including one or more active n-type transistors and one or more active p-type transistors disposed together within a cell boundary. The active n-type transistors may be defined by a first diffusion region (dr1), and the active p-type transistors may be defined by a second active diffusion region (dr2). As such, the active n-type transistors have a first diffusion region (i.e., dr1) formed within the cell boundary at a first end of the cell structure, and also, the active p-type transistors have a second diffusion region (i.e., d2r) formed within the cell boundary at a second end of the cell structure. In some instances, p-type transistors may refer to PFETs, and n-type transistors may refer to NFETs, and also, the logic cell structure may have any number of PFETs and NFETs. For instance, the logic cell structure shown in FIG. 1A provides two active PFETs, 2 inactive PFETs, and 2 active NFETs; however, any number of active and/or inactive PFETs/NFETs may be used to configure the logic cell structure in various physical circuit designs.

Also, the cell architecture 104A may have poly-silicon (poly-Si) gates that extend over the diffusion regions (dr1, dr2) and between metal contact regions (metal). Also, the cell architecture 104A may have one or more tie-gates that are formed adjacent and/or overlie the outside-edge poly_Si gates near the outside edges of the cell boundary. In various instances, the tie-gates are tied (or coupled) to a supply voltage source, such as, e.g., VDD or ground (VSS, GND), wherein p-type tie-gates may be tied to VDD for inactive p-type transistors, which turns them off and isolates them from neighboring cells at block level, and also, wherein n-type tie-gates may be tied to VSS or GND for inactive n-type transistors, which turns them off and also isolates them from neighboring cells at block level. Also, in various instances, transistors provided with tie-gates may be active transistors, inactive transistors, or some combination of active and inactive transistors. Further, in some instances, the high-drive cell structure may be defined by a large active diffusion region (dr1). As described herein, the various cell architectures 104B-104F shown in FIGS. 1B-1F may have similar features, behaviors and characteristics as provided in the cell architecture 104A shown in FIG. 1A.

As shown in FIG. 1B, the cell architecture 104B may be implemented with a low-drive logic cell structure and various diffusion box regions. For instance, the cell architecture 104B may refer to the cell structure with multiple transistors including an active transistor and an inactive transistor disposed together within a cell boundary. The active n-type transistors may be defined by a first active diffusion region (dr1), and the active p-type transistors may be defined by a second active diffusion region (dr2). As such, the active n-type transistors refer to the first diffusion region (i.e., dr1) formed within the cell boundary at a first end of the cell structure, and also, the active p-type transistors may refer to the second diffusion region (i.e., dr2) formed within the cell boundary at a second end of the cell structure. In some instances, the active p-type transistors may also have a vacated region (e.g., clear_diff_box) that is cut-out from the second diffusion region (i.e., dr2). In various instances, the vacated region (clear_diff_box) may have a fixed height and/or a fixed width. In other instances, the vacated region (clear_diff_box) may be evenly cut (uniform cut) or may be unevenly cut (non-uniform cut). In still other instances, the vacated region (clear_diff_box) may have a selectively variable height and/or a selectively variable width. These concepts are described in greater detail herein below in reference to FIGS. 1C-1F and FIGS. 3-8.

In some implementations, the cell architecture 104B may have a cell structure that is configured as a low-drive cell or a high-drive cell with placement at block level, and also, the vacated region may be cut (or cut-out) from the second diffusion region (dr2) so as to provide the cell structure with reduced timing variability. In some instances, the vacated region (clear_diff_box) may refer to a clear diffusion box that is removed from the second diffusion region (dr2). In other instances, the clear diffusion box (clear_diff_box) may have a rectangular shape with a fixed width and a fixed height. Also, in some instances, the vacated region (clear_diff_box) cut (or cut-out) from the second diffusion region (dr2) may be directed away from the second end and toward the active n-type transistors in the first diffusion region (dr1).

As shown in FIG. 1C, the hybrid cell architecture 104C may be implemented with the high-drive logic cell structure shown in FIG. 1A (e.g., disposed on a left-side) along with a low-drive logic cell structure shown in FIG. 1B (e.g., disposed on a right-side) along with various diffusion box regions. As described herein, the hybrid cell architecture 104C shown in FIG. 1C may have similar features, behaviors and characteristics as provided in the cell architectures 104A-104B as respectively shown in FIGS. 1A-1B.

In various implementations, the hybrid cell architecture 104C may refer to a hybrid cell structure having multiple transistors including active n-type transistors and active p-type transistors disposed together within multiple cell boundaries. At the first end, the active n-type transistors may be defined by the first diffusion region (dr1), and also, at the second end, the active p-type transistors may be defined by the second diffusion region (dr2). As such, the active n-type transistors may utilize the first diffusion region (i.e., dr1) formed within the cell boundaries at the first end of the hybrid cell structure, and also, the active p-type transistors may utilize the second diffusion region (i.e., dr2) formed within the cell boundaries at the second end of the hybrid cell structure. In reference to the low-drive cell on the right-side, the active p-type transistors may have the vacated region (e.g., clear_diff_box) that is cut (or cut-out) from the second diffusion region (i.e., dr2). In various instances, the vacated region (clear_diff_box) may have a fixed height and/or a fixed width, or the vacated region (clear_diff_box) may be evenly cut (uniform cut) or may be unevenly cut (non-uniform cut).

In some implementations, when low-drive cells are placed next to high-drive cells, the hybrid cell architecture 104C in FIG. 1C may provide symmetrical context at boundary of each cell in such a way that timing variability is significantly improved. Thus, the hybrid cell architecture 104C in FIG. 1C may be used to provide an effective cell structure that reduces block level timing variability in physical layout designs. In various instances, the inactive p-type transistor in the middle (or center) of the cell structure is placed at the cell boundaries of the right-side/left-side cell structures so that the center-placed inactive p-type transistor may be shared by both (right/left) sides. Also, in this instance, the center tie-gate is tied-off and provides isolation between the active p-type transistors of the right-side cell structure and the left-side cell structure. Also, depending on the process, standard cell architecture following the various diffusion box implementations described herein for low/high-drive cells may be used to improve timing variability. Also, NFET/PFET are interchangeable.

As shown in FIG. 1D, the cell architecture 104D may be implemented with a low-drive logic cell structure and with various diffusion box regions. As described herein, the cell architecture 104D shown in FIG. 1D has similar features, behaviors and characteristics as provided in the cell architectures 104A-104B as respectively shown in FIGS. 1A-1B.

In various implementations, the cell architecture 104D may refer to a cell structure with multiple transistors including the active n-type transistors and the active p-type transistors disposed together within the cell boundary. The active n-type transistors may be defined by the first diffusion region (dr1), and the active p-type transistors may be defined by the second diffusion region (dr2). The active n-type transistor may have the first diffusion region (dr1) formed within the cell boundary at the first end of the cell structure, and the active p-type transistor may have the second diffusion region (dr2) formed within the cell boundary at the second end of the cell structure. In some instances, inactive transistors having tie-gates may be applied only at the cell boundary, and also, the clear diffusion box may be applied on active transistors so as to create low drive cells from high drive cells. In some instances, the vacated region (clear_diff_box) may have a fixed height and/or a fixed width, or in other instances, the vacated region (clear_diff_box) may be evenly cut (uniform cut) or may be unevenly cut (non-uniform cut).

In various implementations, the second diffusion region (dr2) may include a first end-diffusion box region (EDB_1) disposed at a first side (e.g., left-side), and also, the second diffusion region (dr2) may have a second end-diffusion box region (EDB_2) disposed at a second side (e.g., right-side) that is opposite the first side. In some instances, the first end-diffusion box region (EDB_1) and the second end-diffusion box region (EDB_2) may have a rectangular shape with a fixed height (h0) and/or a fixed width (w0). In other instances, the first end-diffusion box region (EDB_1) and/or the second end-diffusion box region (EDB_2) may have a rectangular shape with a selectively variable height (h0) and/or a selectively variable width (w0).

As shown in FIG. 1E, the cell architecture 104E may be implemented with a low-drive logic cell structure and with various diffusion box regions. As described herein, the cell architecture 104E shown in FIG. 1E has similar features, behaviors and characteristics as provided in the cell architectures 104A-104B as respectively shown in FIGS. 1A-1B.

In various implementations, the cell architecture 104E may refer to a cell structure with multiple transistors including the active n-type transistors and the active p-type transistors disposed together within the cell boundary. The active n-type transistors may be defined by the first diffusion region (dr1), and the active p-type transistors may be defined by second diffusion region (dr2). The active n-type transistors have the first diffusion region (dr1) formed within the cell boundary at the first end of the cell structure, and the active p-type transistors have the second diffusion region (dr2) formed within the cell boundary at the second end of the cell structure. In various instances, the active p-type transistors may also have the vacated region (e.g., clear_diff_box) that is cut (or cut-out) from the second diffusion region (dr2). In some instances, the vacated region (clear_diff_box) may have a selectively variable height and/or a selectively variable width, or in other instances, the vacated region (clear_diff_box) may be evenly cut (uniform cut) or may be unevenly cut (non-uniform cut). Also, in some instances, the vacated region (clear_diff_box) may be disposed adjacent to multiple poly-Si gates.

In various implementations, the second diffusion region (dr2) may include the first end-diffusion box region (EDB_1) disposed at the first side (e.g., left-side), and also, the second diffusion region (dr2) may have the second end-diffusion box region (EDB_2) disposed at the second side (e.g., right-side) that is opposite the first side. In some instances, the first end-diffusion box region (EDB_1) may have a rectangular shape with a selectively variable height (h1) and/or a selectively variable width (w1). Further, the second end-diffusion box region (EDB_2) may have a rectangular shape with a selectively variable height (h2) and/or a selectively variable width (w2).

As shown in FIG. 1F, the cell architecture 104F may be implemented with a low-drive logic cell structure and with various diffusion box regions. As described herein, the cell architecture 104F shown in FIG. 1F has similar features, behaviors and characteristics as provided in the cell architectures 104A-104B as respectively shown in FIGS. 1A-1B.

In various implementations, the cell architecture 104F may refer to a cell structure with multiple transistors including the active n-type transistors and the active p-type transistors disposed together within the cell boundary. The active n-type transistors may be defined by the first diffusion region (dr1), and the active p-type transistors may be defined by the second diffusion region (dr2). The active n-type transistors may have the first diffusion region (dr1) formed within the cell boundary at the first end of the cell structure, and the active p-type transistors may have the second diffusion region (dr2) formed within the cell boundary at the second end of the cell structure. In various instances, the active p-type transistors may also have the vacated region (e.g., clear_diff_box) that is cut (or cut-out) from the second diffusion region (dr2). In some instances, the vacated region (clear_diff_box) may have a selectively variable height and/or a selectively variable width, or in other instances, the vacated region (clear_diff_box) may be evenly cut (uniform cut) or may be unevenly cut (non-uniform cut). Also, in some instances, the vacated region (clear_diff_box) may be disposed adjacent to a single poly-Si gate.

In various implementations, the second diffusion region (dr2) may include the first end-diffusion box region (EDB_1) disposed at the first side (e.g., left-side), and also, the second diffusion region (dr2) may have the second end-diffusion box region (EDB_2) disposed at the second side (e.g., right-side) that is opposite the first side. In some instances, the first end-diffusion box region (EDB_1) may have a rectangular shape with a selectively variable height (h3) and/or a selectively variable width (w3). Further, the second end-diffusion box region (EDB_2) may have a rectangular shape with a selectively variable height (h4) and/or a selectively variable width (w4).

Figures 2, 3:
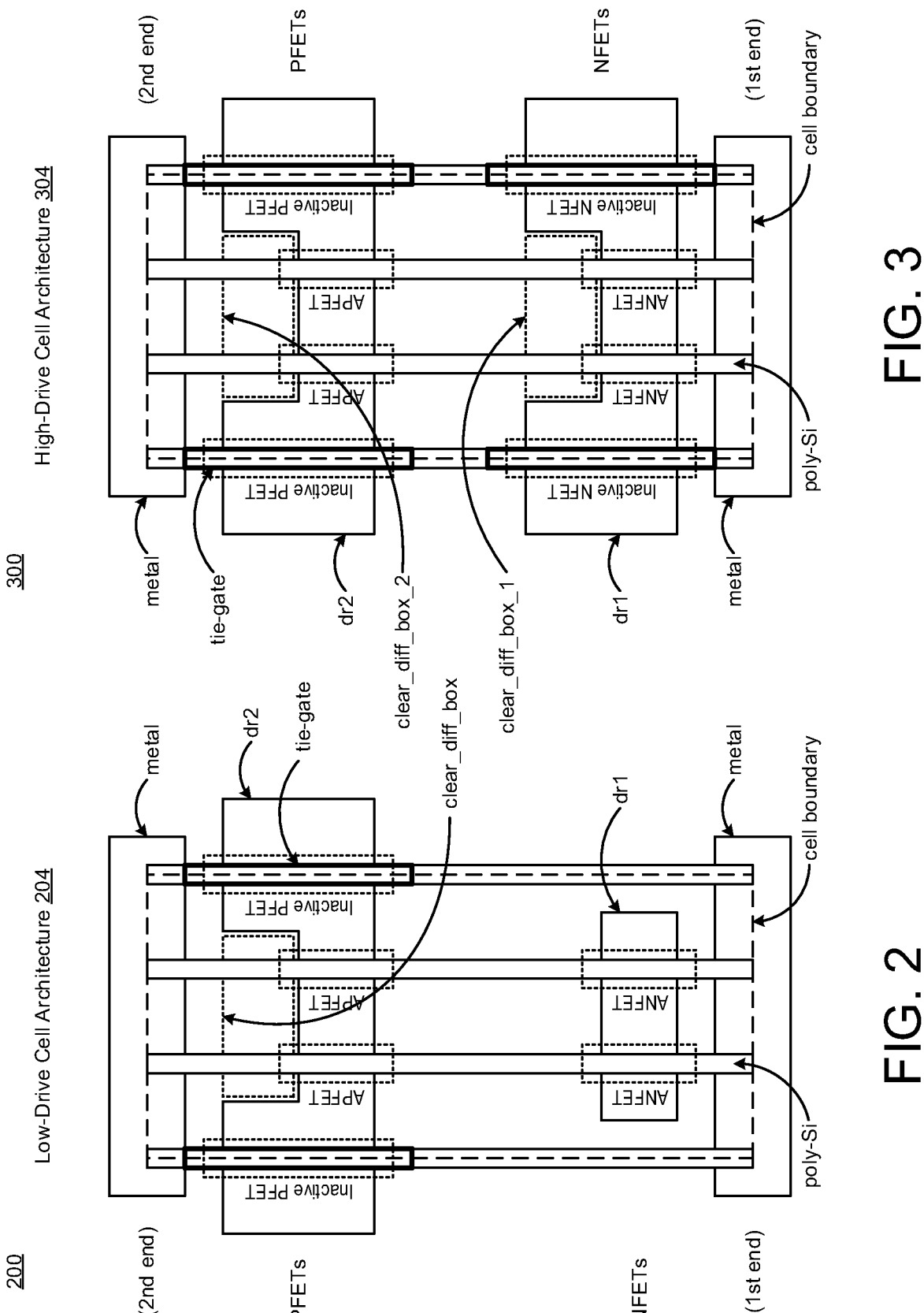
FIGS. 2-8 illustrate diagrams of various low-drive cell architectures in accordance with various implementations described herein.
Figures 4, 5:
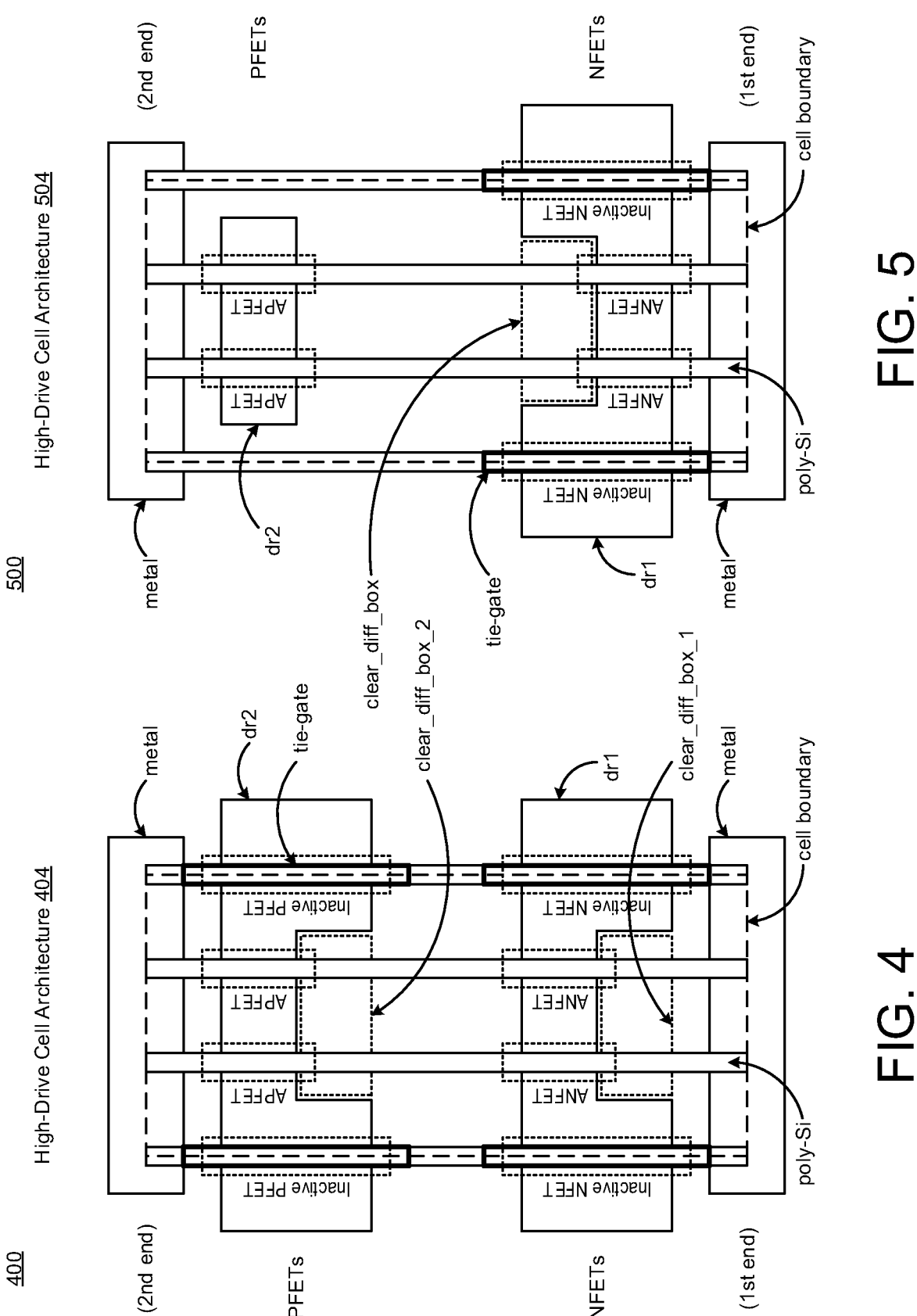
Figures 6, 7:
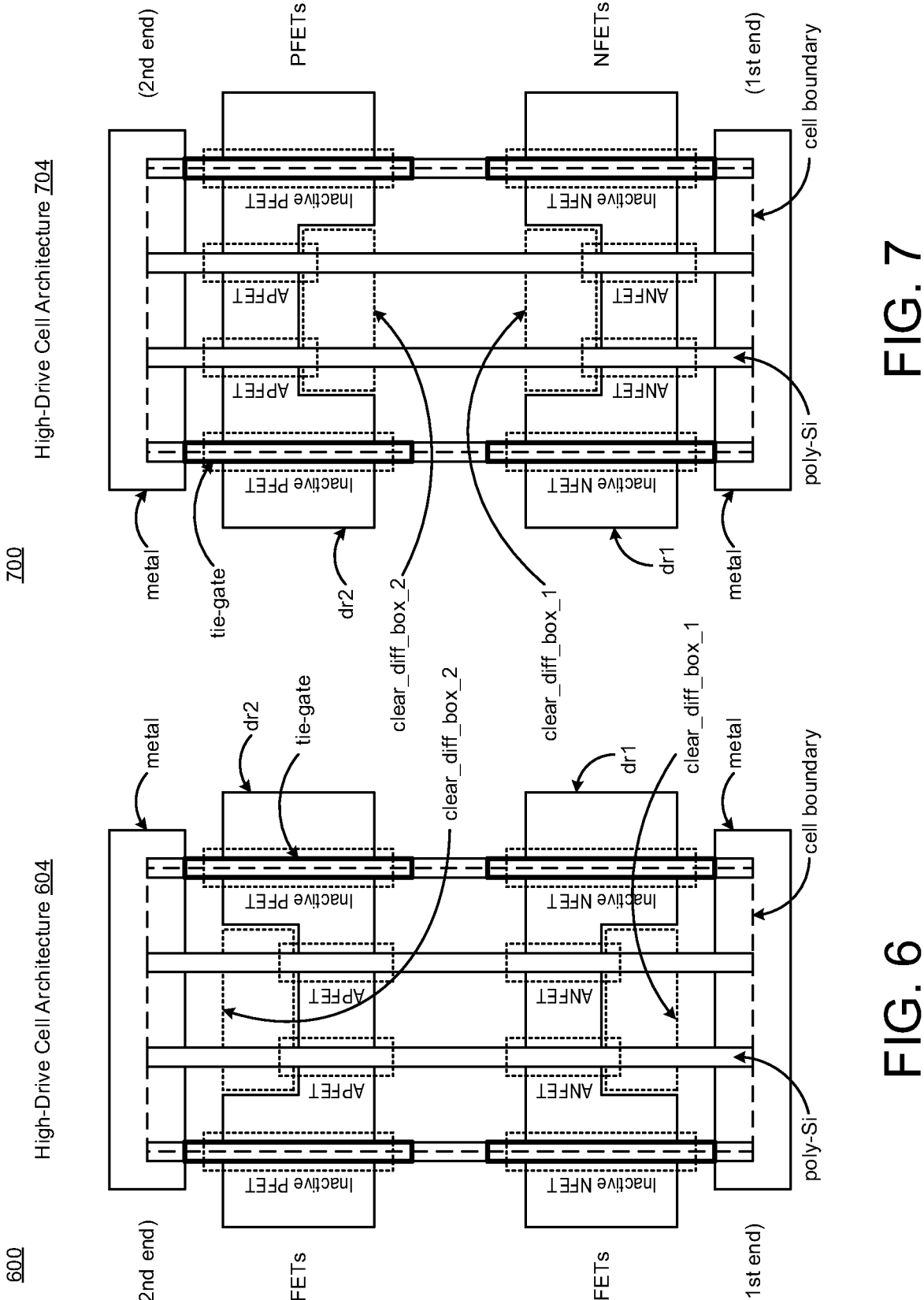
Figure 8:
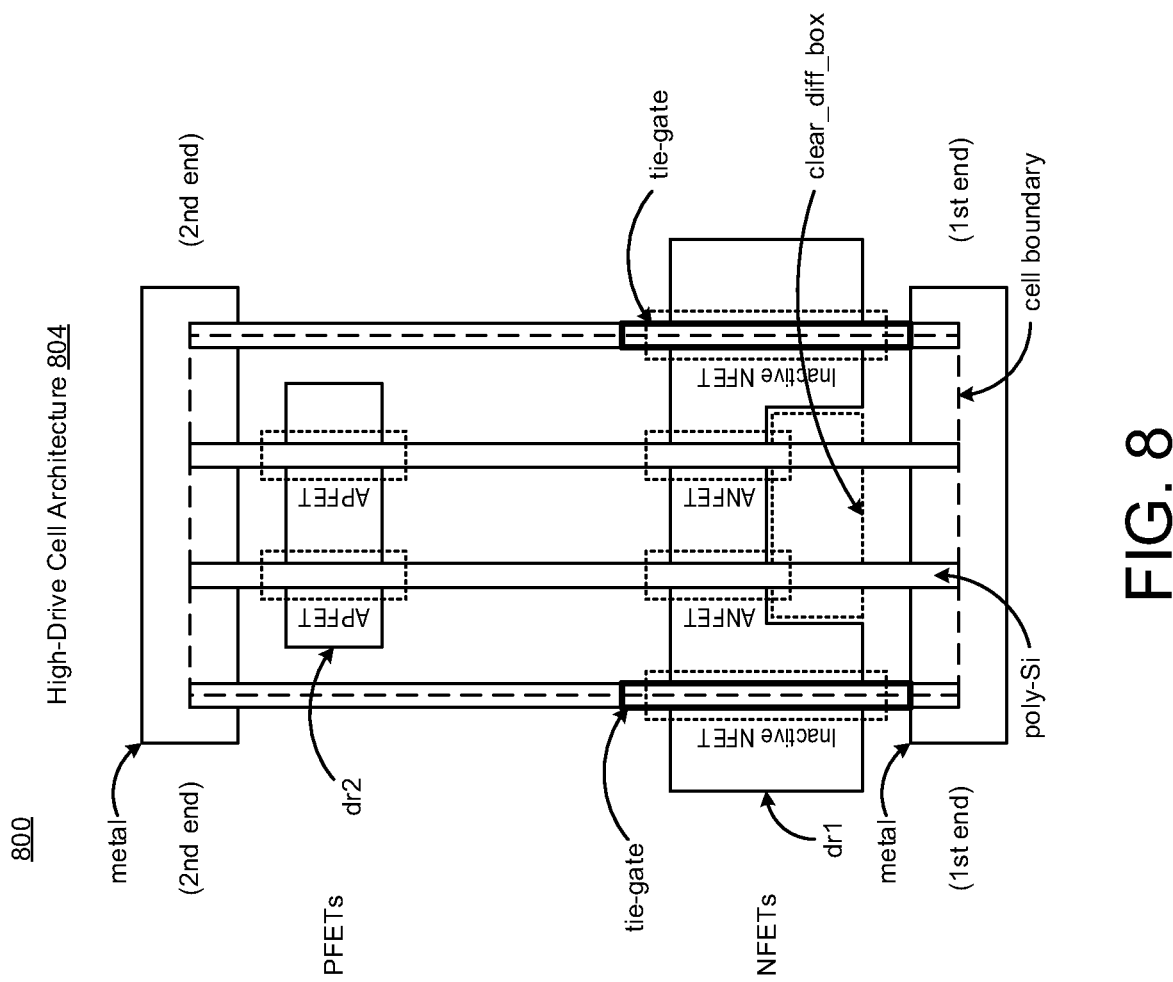

FIGS. 2-8 illustrate diagrams of various low-drive cell architectures in accordance with various implementations described herein. In particular, FIG. 2 shows a diagram 200 of a cell architecture 204 with a low-drive cell structure, FIG. 3 shows a diagram 300 of a cell architecture 304 with a high-drive cell structure, FIG. 4 shows another diagram 400 of a cell architecture 404 with a high-drive cell structure, FIG. 5 shows another diagram 500 of a cell architecture 504 with a high-drive cell structure, FIG. 6 shows another diagram 600 of a cell architecture 604 with a high-drive cell structure, FIG. 7 shows another diagram 700 of a cell architecture 704 with a high-drive cell structure, and FIG. 8 shows another diagram 800 of a cell architecture 804 with a high-drive cell structure.

In various implementations, the various cell architectures may be implemented as a system or a device having various integrated circuit (IC) components that are arranged and coupled together as an assemblage or a combination of parts that provide for physical circuit designs and related circuit structures. In some instances, a method of designing, providing, fabricating and manufacturing various cell architectures as an integrated system or device may involve use of various IC circuits and components described herein so as to implement various related fabrication schemes and techniques associated therewith. Also, the various cell architectures may be integrated with various computing circuitry and components on a single chip, and the various cell architectures may be implemented and/or incorporated in various types of embedded systems for automotive, electronic, mobile, server and Internet-of-things (IoT) applications, including remote sensor nodes.

As shown in FIG. 2, the cell architecture 204 may be implemented with a low-drive logic cell structure and various diffusion box regions. For instance, the cell architecture 204 may refer to a cell structure with multiple transistors including active n-type transistors, active p-type transistors and inactive p-type transistors disposed together within the cell boundary. Each active p-type transistor may refer to an active PFET (APFET), and each active n-type transistor may refer to an active NFET (ANFET). The active n-type transistors may be defined by the first diffusion region (dr1), and also, the active p-type transistors may be defined by the second diffusion region (dr2). Thus, the active n-type transistors may have the first diffusion region (dr1) formed within the cell boundary at the first end of the cell structure, and the active p-type transistors may have the second diffusion region (dr2) formed within the cell boundary at the second end of the cell structure. In some instances, the active p-type transistors may have the vacated region (clear_diff_box) that is cut (or cut-out) from the second diffusion region (dr2). In some instances, the vacated region (clear_diff_box) may have a fixed height and/or a fixed width. In various instances, the vacated region (clear_diff_box) may be evenly cut (uniform cut) or may be unevenly cut (non-uniform cut).

In various implementations, the cell architecture 204 may have a cell structure that is configured as a low-drive cell or as a high-drive cell with placement at block level, and also, the vacated region may be cut (or cut-out) from the second diffusion region (dr2) so as to provide the cell structure with reduced timing variability. In some instances, the vacated region (clear_diff_box) may refer to the clear diffusion box that is removed from the second diffusion region (dr2). In other instances, the clear diffusion box (clear_diff_box) may have a rectangular shape with a fixed width and/or a fixed height. In various instances, the vacated region (clear_diff_box) cut (or cut-out) from the second diffusion region (dr2) may be directed toward the second end and away from the active n-type transistors.

As shown in FIG. 3, the cell architecture 304 may be implemented with a high-drive logic cell structure and various diffusion box regions. For instance, the cell architecture 304 may refer to a cell structure with multiple transistors including active n-type transistors, inactive n-type transistors, active p-type transistors and inactive p-type transistors disposed together within the cell boundary. The active n-type transistors may be defined by the first diffusion region (dr1), and also, the active p-type transistors may be defined by the second diffusion region (dr2). Thus, the active n-type transistors may have the first diffusion region (dr1) formed within the cell boundary at the first end of the cell structure, and the active p-type transistors may have the second diffusion region (dr2) formed within the cell boundary at the second end of the cell structure. In various instances, the active n-type transistors may have the vacated region (clear_diff_box_1) that is cut (or cut-out) from the first diffusion region (dr1). In addition, the active p-type transistors may also have another vacated region (clear_diff_box_2) that is cut (or cut-out) from the second diffusion region (dr2). Also, in some instances, the vacated regions (clear_diff_box1, clear_diff_box_2) may have a fixed height and/or a fixed width. Further, the vacated regions (clear_diff_box_1, clear_diff_box_2) may be evenly cut (uniform cut) or may be unevenly cut (non-uniform cut).

In various implementations, the cell architecture 304 may have a cell structure that is configured as a high-drive cell or as a low-drive cell with placement at block level, and also, the vacated regions may be cut (or cut-out) from the diffusion regions (dr1, dr2) so as to provide a cell structure with reduced timing variability. In some instances, the active n-type transistors may have the first vacated region (clear_diff_box_1) cut-out from the first diffusion region (dr1), and further, the active p-type transistors may have the second vacated region (clear_diff_box_2) cut-out from the second diffusion region (dr2). In some instances, the first vacated region (clear_diff_box_1) may be directed away from the first end and toward the active p-type transistors (dr2), and also, the second vacated region (clear_diff_box_2) may be directed toward the second end and away from the active n-type transistors.

As shown in FIG. 4, the cell architecture 404 may be implemented with a high-drive logic cell structure and various diffusion box regions. For instance, the cell architecture 404 may refer to a cell structure with multiple transistors including active n-type transistors, inactive n-type transistors, active p-type transistors and inactive p-type transistors disposed together within the cell boundary. The active n-type transistors may be defined by the first diffusion region (dr1), and also, the active p-type transistors may be defined by the second diffusion region (dr2). Thus, the active n-type transistors may have the first diffusion region (dr1) formed within the cell boundary at the first end of the cell structure, and the active p-type transistors may have the second diffusion region (dr2) formed within the cell boundary at the second end of the cell structure. In various instances, the active n-type transistors may have the vacated region (clear_diff_box_1) that is cut (or cut-out) from the first diffusion region (dr1). In addition, the active p-type transistors may also have another vacated region (clear_diff_box_2) that is cut (or cut-out) from the second diffusion region (dr2). Also, in some instances, the vacated regions (clear_diff_box1, clear_diff_box_2) may have a fixed height and/or a fixed width. Further, the vacated regions (clear_diff_box_1, clear_diff_box_2) may be evenly cut (uniform cut) or may be unevenly cut (non-uniform cut).

In various implementations, the cell architecture 304 may have a cell structure that is configured as a high-drive cell or as a low-drive cell with placement at block level, and also, the vacated regions may be cut (or cut-out) from the diffusion regions (dr1, dr2) so as to provide a cell structure with reduced timing variability. In some instances, the active n-type transistors may have the first vacated region (clear_diff_box_1) cut-out from the first diffusion region (dr1), and further, the active p-type transistors may have the second vacated region (clear_diff_box_2) cut-out from the second diffusion region (dr2). In some instances, the first vacated region (clear_diff_box_1) may be directed toward the first end and away the active p-type transistors (dr2), and also, the second vacated region (clear_diff_box_2) may be directed away from the second end and toward the active n-type transistors.

As shown in FIG. 5, the cell architecture 504 may be implemented with a high-drive logic cell structure and various diffusion box regions. For instance, the cell architecture 504 may refer to a cell structure with multiple transistors including active n-type transistors, inactive n-type transistors and active p-type transistors disposed together within the cell boundary. The active n-type transistors may be defined by the active diffusion region (dr1), and also, the active p-type transistors may be defined by the inactive diffusion region (dr2). Thus, the active n-type transistors may have the first diffusion region (dr1) formed within the cell boundary at the first end of the cell structure, and the active p-type transistors may have the second diffusion region (dr2) formed within the cell boundary at the second end of the cell structure. In various instances, the active n-type transistors may have the vacated region (clear_diff_box) that is cut (or cut-out) from the first diffusion region (dr1). In some instances, the vacated region (clear_diff_box) may have a fixed height and/or a fixed width. In various instances, the vacated region (clear_diff_box) may be evenly cut (uniform cut) or may be unevenly cut (non-uniform cut).

In various implementations, the cell architecture 504 may have a cell structure that is configured as a high-drive cell or as a low-drive cell with placement at block level, and also, the vacated region may be cut (or cut-out) from the first diffusion region (dr1) so as to provide the cell structure with reduced timing variability. Also, in some instances, the vacated region (clear_diff_box) may refer to the clear diffusion box that is removed from the first diffusion region (dr1). In other instances, the clear diffusion box (clear_diff_box) may have a rectangular shape with a fixed width and/or a fixed height. In various instances, the vacated region (clear_diff_box) cut (or cut-out) from the first diffusion region (dr1) may be directed away from first end and toward the active p-type transistors.

As shown in FIG. 6, the cell architecture 604 may be implemented with a high-drive logic cell structure and various diffusion box regions. For instance, the cell architecture 604 may refer to a cell structure with multiple transistors including active n-type transistors, inactive n-type transistors, active p-type transistors and inactive p-type transistors disposed together within the cell boundary. The active n-type transistors may be defined by the active diffusion region (dr1), and also, the active p-type transistors may be defined by the inactive diffusion region (dr2). Thus, the active n-type transistors may have the first diffusion region (dr1) formed within the cell boundary at the first end of the cell structure, and the active p-type transistors may have the second diffusion region (dr2) formed within the cell boundary at the second end of the cell structure. In various instances, the active n-type transistors may have the vacated region (clear_diff_box_1) that is cut (or cut-out) from the first diffusion region (dr1). In addition, the active p-type transistors may also have another vacated region (clear_diff_box_2) that is cut (or cut-out) from the second diffusion region (dr2). Also, in some instances, the vacated regions (clear_diff_box1, clear_diff_box_2) may have a fixed height and/or a fixed width. Further, the vacated regions (clear_diff_box_1, clear_diff_box_2) may be evenly cut (uniform cut) or may be unevenly cut (non-uniform cut).

In various implementations, the cell architecture 604 may have a cell structure that is configured as a high-drive cell or as a low-drive cell with placement at block level, and also, the vacated regions may be cut (or cut-out) from the diffusion regions (dr1, dr2) so as to provide a cell structure with reduced timing variability. In some instances, the active n-type transistors may have the first vacated region (clear_diff_box_1) cut-out from the first diffusion region (dr1), and further, the active p-type transistors may have the second vacated region (clear_diff_box_2) cut-out from the second diffusion region (dr2). In some instances, the first vacated region (clear_diff_box_1) may be directed toward the first end and away the active p-type transistors (dr2), and also, the second vacated region (clear_diff_box_2) may be directed toward the second end and away from the active n-type transistors.

As shown in FIG. 7, the cell architecture 704 may be implemented with a high-drive logic cell structure and various diffusion box regions. For instance, the cell architecture 704 may refer to a cell structure with multiple transistors including active n-type transistors, inactive n-type transistors, active p-type transistors and inactive p-type transistors disposed together within the cell boundary. The active n-type transistors may be defined by the active diffusion region (dr1), and also, the active p-type transistors may be defined by the inactive diffusion region (dr2). Thus, the active n-type transistors may have the first diffusion region (dr1) formed within the cell boundary at the first end of the cell structure, and the active p-type transistors may have the second diffusion region (dr2) formed within the cell boundary at the second end of the cell structure. In various instances, the active n-type transistors may have the vacated region (clear_diff_box_1) that is cut (or cut-out) from the first diffusion region (dr1). In addition, the active p-type transistors may also have another vacated region (clear_diff_box_2) that is cut (or cut-out) from the second diffusion region (dr2). Also, in some instances, the vacated regions (clear_diff_box1, clear_diff_box_2) may have a fixed height and/or a fixed width. Further, the vacated regions (clear_diff_box_1, clear_diff_box_2) may be evenly cut (uniform cut) or may be unevenly cut (non-uniform cut).

In various implementations, the cell architecture 704 may have a cell structure that is configured as a high-drive cell or as a low-drive cell with placement at block level, and also, the vacated regions may be cut (or cut-out) from the diffusion regions (dr1, dr2) so as to provide a cell structure with reduced timing variability. In some instances, the active n-type transistors may have the first vacated region (clear_diff_box_1) cut-out from the first diffusion region (dr1), and further, the active p-type transistors may have the second vacated region (clear_diff_box_2) cut-out from the second diffusion region (dr2). In some instances, the first vacated region (clear_diff_box_1) may be directed away from the first end and toward the active p-type transistors (dr2), and also, the second vacated region (clear_diff_box_2) may be directed away from the second end and toward the active n-type transistors.

As shown in FIG. 8, the cell architecture 804 may be implemented with a high-drive logic cell structure and various diffusion box regions. For instance, the cell architecture 804 may refer to a cell structure with multiple transistors including active n-type transistors, inactive n-type transistors and active p-type transistors disposed together within the cell boundary. The active n-type transistors may be defined by the active diffusion region (dr1), and also, the active p-type transistors may be defined by the inactive diffusion region (dr2). Thus, the active n-type transistors may have the first diffusion region (dr1) formed within the cell boundary at the first end of the cell structure, and the active p-type transistors may have the second diffusion region (dr2) formed within the cell boundary at the second end of the cell structure. In various instances, the active n-type transistors may have the vacated region (clear_diff_box) that is cut (or cut-out) from the first diffusion region (dr1). In some instances, the vacated region (clear_diff_box) may have a fixed height and/or a fixed width. In various instances, the vacated region (clear_diff_box) may be evenly cut (uniform cut) or may be unevenly cut (non-uniform cut).

In various implementations, the cell architecture 804 may have a cell structure that is configured as a high-drive cell or as a low-drive cell with placement at block level, and also, the vacated region may be cut (or cut-out) from the first diffusion region (dr1) so as to provide the cell structure with reduced timing variability. Also, in some instances, the vacated region (clear_diff_box) may refer to the clear diffusion box that is removed from the first diffusion region (dr1). In other instances, the clear diffusion box (clear_diff_box) may have a rectangular shape with a fixed width and/or a fixed height. In various instances, the vacated region (clear_diff_box) cut (or cut-out) from the first diffusion region (dr1) may be directed away from first end and away from the active n-type transistors.

FIG. 9 illustrates a process diagram of a method 900 for providing various cell architectures in accordance with various implementations described herein.

It should be understood that even though method 900 indicates a particular order of operation execution, in some cases, various portions of operations may be executed in a different order, and on different systems. In other cases, additional operations and/or steps may be added to and/or omitted from method 900. Also, method 900 may be implemented in hardware and/or software. For instance, if implemented in hardware, method 900 may be implemented with various components and/or circuitry, as described herein above in FIGS. 1A-1F and FIGS. 2-8. In other instances, if implemented in software, method 900 may be implemented as a program or related software instruction process configured for providing various cell architectures, as described herein. Also, if implemented in software, instructions related to implementing method 900 may be stored in memory and/or a database. In some instances, a computer or various other types of computing devices with a processor and memory may be configured to perform method 900.

As described in reference to FIG. 9, the method 900 may be used for fabricating and/or manufacturing, or causing to be fabricated and/or manufactured, an integrated circuit (IC) that implements various schemes and techniques in physical design as described herein so as to thereby provide for various cell architectures including providing logic cell structures with various diffusion box regions using various devices, components and/or circuitry.

In some implementations, at block 910, method 900 may provide a cell structure with a cell boundary. At block 920, method 900 may provide one or more active n-type transistors with a first diffusion region that is formed within the cell boundary at a first end of the cell structure. Also, at block 930, method 900 may provide one or more active p-type transistors with a second diffusion region that is formed within the cell boundary at a second end of the cell structure. At block 940, method 900 may add at least one vacated region to the active p-type transistors and/or the n-type transistors, wherein the at least one vacated region is cut-out from the second diffusion region for the p-type transistors and/or the first diffusion region for the n-type transistors. In some instances, method 900 may add a vacated region to the active p-type transistors, wherein the vacated region is cut-out from the second diffusion region for the p-type transistors. In other instances, method 900 may add a vacated region to the active n-type transistors, wherein the vacated region is cut-out from the first diffusion region for the n-type transistors. In still other instances, method 900 may add a first vacated region to the active p-type transistors and add a second vacated region to the n-type transistors, wherein the first vacated region is cut-out from the second diffusion region for the p-type transistors, and wherein the second vacated region is cut-out from the first diffusion region for the n-type transistors. Further, in some instances, at block 950, method 900 may manufacture, or cause to be manufactured, an integrated circuit having the cell structure with the one or more active n-type transistors and the one or more active p-type transistors.

In some implementations, the cell structure may refer to a low-drive cell or a high-drive cell having placement at block level, and the vacated region cut-out from the second diffusion region may provide the cell structure with a reduced timing variability. Also, in some instances, the vacated region may refer to a clear diffusion box removed from the second diffusion region, and the clear diffusion box may have a rectangular shape with a fixed width and a fixed height. Also, in other instances, the second diffusion region may have a first end-diffusion box region disposed at a first side, and also, the second diffusion region may have a second end-diffusion box region disposed at a second side that is disposed opposite to the first side. In this instance, the first end-diffusion box region and the second end-diffusion box region may have a rectangular shape with a fixed width and a fixed height. Otherwise, the first end-diffusion box region and the second end-diffusion box region may have a rectangular shape with a selectively variable width and a selectively variable height.

In some implementations, the vacated region cut-out from the second diffusion region is directed away from the second end and toward the active n-type transistors. Otherwise, in other instances, the vacated region cut-out from the second diffusion region may be directed toward the second end and away from the active n-type transistors.

In some implementations, the active n-type transistors may have a first vacated region cut-out from the first diffusion region, and the active p-type transistors may have the vacated region as a second vacated region cut-out from the second diffusion region. The first vacated region may be directed away from the first end and toward the active p-type transistors, and the second vacated region may be directed toward the second end and away from the active n-type transistors.

In some implementations, the active n-type transistors may have a first vacated region cut-out from the first diffusion region, and the active p-type transistors may have the vacated region as a second vacated region cut-out from the second diffusion region. The first vacated region may be directed toward the first end and away the active p-type transistors, and the second vacated region may be directed away from the second end and toward the active n-type transistors.

In some implementations, the active n-type transistors may have a first vacated region cut-out from the first diffusion region, and the active p-type transistors may have the vacated region as a second vacated region cut-out from the second diffusion region. The first vacated region may be directed toward the first end and away the active p-type transistors, and the second vacated region may be directed toward the second end and away from the active n-type transistors.

In some implementations, the active n-type transistors may have a first vacated region cut-out from the first diffusion region, and the active p-type transistors may have the vacated region as a second vacated region cut-out from the second diffusion region. The first vacated region may be directed away from the first end and toward the active p-type transistors, and the second vacated region may be directed away from the second end and toward the active n-type transistors.

It should be intended that the subject matter of the claims not be limited to various implementations and/or illustrations provided herein, but should include any modified forms of those implementations including portions of implementations and combinations of various elements in reference to different implementations in accordance with the claims. It should also be appreciated that in development of any such implementation, as in any engineering or design project, numerous implementation-specific decisions should be made to achieve developers' specific goals, such as, e.g., compliance with system-related constraints and/or business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device with a cell structure having multiple transistors including active n-type transistors and active p-type transistors disposed together within a cell boundary. The active n-type transistors may have a first diffusion region formed within the cell boundary at a first end of the cell structure, and the active p-type transistors have a second diffusion region formed within the cell boundary at a second end of the cell structure. The active p-type transistors may have a vacated region cut-out from the second diffusion region.

Described herein are various implementations of a device with a cell structure having multiple transistors including active n-type transistors and active p-type transistors disposed together within a cell boundary. The active n-type transistors may have a first diffusion region formed within the cell boundary at a first end of the cell structure, and the active n-type transistors may also have a vacated region cut-out from the first diffusion region. The active p-type transistors may have a second diffusion region formed within the cell boundary at a second end of the cell structure.

Described herein are various implementations of a method. The method may provide a cell structure with a cell boundary. The method may provide active n-type transistors with a first diffusion region that is formed within the cell boundary at a first end of the cell structure. The method may provide active p-type transistors with a second diffusion region that is formed within the cell boundary at a second end of the cell structure. The method may add a vacated region to at least one of the active p-type transistors and the active n-type transistors, wherein the vacated region is cut-out from the second diffusion region for the active p-type transistors, and wherein the vacated region is cut-out from the first diffusion region for the active n-type transistors. Also, the method may manufacture, or cause to be manufactured, an integrated circuit having the cell structure with the active n-type transistors and the active p-type transistors.

Reference has been made in detail to various implementations, examples of which are illustrated in accompanying drawings and figures. In the following detailed description, numerous specific details are set forth to provide a thorough understanding of the disclosure provided herein. However, the disclosure provided herein may be practiced without these specific details. In various implementations, well-known methods, procedures, components, circuits and networks have not been described in detail so as not to unnecessarily obscure details of the embodiments.

It should also be understood that, although various terms first, second, etc. may be used herein to describe various elements, these elements should not be limited by these terms. These terms are only used to distinguish one element from another. For instance, a first element could be termed a second element, and, similarly, a second element could be termed a first element. Also, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and various other similar terms that indicate relative positions above or below a given point or element may be used in connection with various implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, specific features and/or acts described above are disclosed as example forms of implementing the claims.

What is claimed is:

1. A device comprising:
a cell structure having multiple transistors, wherein the multiple transistors comprise:
   active n-type transistors and active p-type transistors disposed together within a cell boundary;
   a first inactive transistor placed at a first side of the cell boundary; and
   a second inactive transistor placed at a second side of the cell boundary;
wherein the active n-type transistors have a first diffusion region formed within the cell boundary at a first end of the cell structure; and
wherein the active p-type transistors, the first inactive transistor and the second inactive transistor have a second diffusion region formed within the cell boundary at a second end of the cell structure, wherein the second diffusion region is continuous and comprises a vacated region disposed between, excluding, the first and second inactive transistors.

2. The device of claim 1, wherein:
the cell structure refers to a low-drive cell or a high-drive cell having placement at block level;
a height of the second diffusion region at the first side of the cell boundary is equal to a height of the second diffusion region at the second side of the cell boundary; or
combinations thereof.

3. The device of claim 1, wherein:
the first inactive transistor and the second inactive transistor are tied to a supply voltage; and
the first side of the cell boundary corresponds to a west side of the cell boundary, and the second side of the cell boundary corresponds to an east side of the cell boundary.

4. The device of claim 1, wherein the vacated region is a portion removed from the second diffusion region, the portion having a rectangular shape with a fixed width and a fixed height that is laterally confined within a span defined by the first and second inactive transistors.

5. The device of claim 1, wherein the second diffusion region has a first end-diffusion box region disposed at a first side of the second diffusion region, and wherein the second diffusion region has a second end-diffusion box region disposed at a second side of the second diffusion region that is opposite the first side.

6. The device of claim 5, wherein the first end-diffusion box region and the second end-diffusion box region have a rectangular shape with a fixed width and a fixed height.

7. The device of claim 5, wherein the first end-diffusion box region and the second end-diffusion box region have a rectangular shape with a selectively variable width and a selectively variable height.

8. The device of claim 1, wherein the vacated region cut-out from the second diffusion region is directed away from the second end and toward the active n-type transistor.

9. The device of claim 1, wherein the vacated region cut-out from the second diffusion region is directed toward the second end and away from the active n-type transistor.

10. The device of claim 1, wherein:
the active n-type transistor has a first vacated region cut-out from the first diffusion region,
the active p-type transistor has the vacated region as a second vacated region cut-out from the second diffusion region,
the first vacated region is directed away from the first end and toward the active p-type transistor, and
the second vacated region is directed toward the second end and away from the active n-type transistor.

11. The device of claim 1, wherein:
the active n-type transistor has a first vacated region cut-out from the first diffusion region,
the active p-type transistor has the vacated region as a second vacated region cut-out from the second diffusion region,
the first vacated region is directed toward the first end and away the active p-type transistor, and
the second vacated region is directed away from the second end and toward the active n-type transistor.

12. The device of claim 1, wherein:
the active n-type transistor has a first vacated region cut-out from the first diffusion region,
the active p-type transistor has the vacated region as a second vacated region cut-out from the second diffusion region,
the first vacated region is directed toward the first end and away the active p-type transistor, and
the second vacated region is directed toward the second end and away from the active n-type transistor.

13. The device of claim 1, wherein:
the active n-type transistor has a first vacated region cut-out from the first diffusion region,
the active p-type transistor has the vacated region as a second vacated region cut-out from the second diffusion region,
the first vacated region is directed away from the first end and toward the active p-type transistor, and
the second vacated region is directed away from the second end and toward the active n-type transistor.

* * * * *